(12) United States Patent
Chu et al.

(10) Patent No.: US 6,396,700 B1
(45) Date of Patent: May 28, 2002

(54) THERMAL SPREADER AND INTERFACE ASSEMBLY FOR HEAT GENERATING COMPONENT OF AN ELECTRONIC DEVICE

(75) Inventors: Richard C. Chu, Poughkeepsie; Michael J. Ellsworth, Jr., Lagrangeville; Robert E. Simons, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,619

(22) Filed: Jun. 29, 2000

(51) Int. Cl.$^7$ ................................................. H05M 7/20
(52) U.S. Cl. ...................... 361/705; 165/80.3; 165/185; 174/16.3; 257/707; 257/713; 361/690; 361/718; 361/722
(58) Field of Search ............................... 165/80.2, 80.3, 165/185; 174/16.3; 257/706–707, 712–713; 361/704–710, 717–720, 722, 690

(56) References Cited

U.S. PATENT DOCUMENTS

| | | | | |
|---|---|---|---|---|
| 4,034,468 A | * | 7/1977 | Koopman | 29/628 |
| 4,034,469 A | * | 7/1977 | Koopman et al. | 29/628 |
| 4,750,086 A | * | 6/1988 | Mittal | 361/382 |
| 5,021,924 A | * | 6/1991 | Kieda et al. | 361/385 |
| 5,247,426 A | * | 9/1993 | Hamburgen et al. | 361/705 |
| 5,510,650 A | * | 4/1996 | Erskine, Jr. | 257/707 |
| 5,591,789 A | * | 1/1997 | Iruvanti et al. | 523/515 |
| 5,604,978 A |   | 2/1997 | Sherif et al. | 29/840 |
| 5,650,662 A | * | 7/1997 | Edwards et al. | 257/700 |
| 5,712,448 A |   | 1/1998 | Vandersande et al. | 136/203 |
| 5,757,073 A | * | 5/1998 | Hoffmeyer | 257/700 |
| 5,790,376 A | * | 8/1998 | Moore | 361/700 |
| 5,844,310 A | * | 12/1998 | Okikawa et al. | 257/712 |
| 5,847,929 A | * | 12/1998 | Bernier et al. | 361/719 |

* cited by examiner

*Primary Examiner*—Gregory Thompson
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

A thermal dissipation assembly is provided for an electronic device. The assembly includes a thermal spreader configured to thermally couple to a surface of a heat generating component of the electronic device. The heat generating component, e.g., an integrated circuit chip, has a non-uniform thermal distribution across a surface thereof between at least one first region of the surface and at least one second region of the surface, with the at least one first region having a higher heat flux than the at least one second region. The assembly further includes a thermal interface for attaching to the surface of the thermal spreader and aligning to contact a portion of the surface of the heat generating component when the thermal dissipation assembly is placed in contact therewith. The thermal interface is patterned to cover only a portion of the surface of the heat generating component to selectively thermally couple the thermal spreader to the surface of the heat generating component.

16 Claims, 6 Drawing Sheets

THERMAL SPREADER AND INTERFACE ASSEMBLY FOR HEAT GENERATING COMPONENT OF AN ELECTRONIC DEVICE

CROSS-REFERENCE TO RELATED APPLICATION

This application contains subject matter which is related to the subject matter of the following co-filed application, which is assigned to the same assignee as this application. The below-listed application is hereby incorporated herein by reference in its entirety:

"THERMOELECTRIC-ENHANCED HEAT SPREADER FOR HEAT GENERATING COMPONENT OF AN ELECTRONIC DEVICE," by Chu et al., Ser. No. 09/606,984.

TECHNICAL FIELD

The present invention is directed to cooling assemblies and other apparatus used for removing heat from electronic devices. More particularly, the present invention is directed to an apparatus for cooling an electronic module through the utilization of a thermal spreader. Even more particularly, this invention is directed to a thermal spreading plate having a thermal interface on only a portion of a main surface thereof. The thermal interface is positioned to align to an area of higher heat flux on a surface of the heat generating element to be cooled.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause for failure of chip devices. Furthermore, it is anticipated that the demand for heat removal from these devices will increase indefinitely. Accordingly, it is seen that there is a large and significant need to provide useful cooling mechanisms for electronic circuit devices.

DISCLOSURE OF THE INVENTION

Complementary metal oxide semiconductor (CMOS) processing has progressed to the point where multiple logic units (such as processors) and their associated control and support circuits (e.g., memory) are being placed on a single integrated circuit chip. From a thermal viewpoint, this results in a chip with a highly non-uniform heat flux distribution. A relatively high heat flux is generated in the processor core region(s) and a relatively low heat flux is produced by the control/support regions. In fact, the core region heat flux can be as much as fifteen times greater than that of the other regions. Thermal paste conduction cooling schemes are not well suited to handle such disparate fluxes. They result in an equally disparate circuit temperature distribution, and more importantly, a much higher absolute junction temperature within the high heat flux regions.

To summarize the present invention, therefore, provided herein in one aspect is a thermal dissipation assembly for facilitating cooling of an electronic device, such as an electronic module. The thermal dissipation assembly includes a thermal spreader which has a surface that is configured to thermally couple to a surface of a heat generating component of the electronic device. The heat generating component has a non-uniform thermal distribution across the surface thereof between at least one first region of the surface and at least one second region of, the surface. The at least one first region has a higher heat flux than the at least one second region. The thermal dissipation assembly further includes a thermal interface coupled to the surface of the thermal spreader for facilitating heat transfer between the heat generating component and the thermal spreader when the thermal spreader is disposed with the thermal interface in contact with the surface of the heat generating component, wherein the thermal interface covers only a portion of the surfaces of the thermal spreader and the heat generating component. In one embodiment, the thermal interface is configured to align to at least a portion of each first region of the surface of the heat generating component having the higher heat flux.

In another aspect, an electronic device is provided having an integrated circuit chip with a non-uniform thermal distribution across a surface thereof between at least one first region of the surface and at least one second region of the surface. The at least one first region has a higher heat flux than the at least one second region. The electronic device further includes a thermal dissipation assembly comprising a thermal spreader and a thermal interface. The thermal spreader has a surface thermally coupled to the surface of the integrated circuit chip, with the thermal interface disposed between the surfaces of the thermal spreader and integrated circuit chip to thermally connect the spreader and the chip. The thermal interface is designed to cover only a portion of the surface of the integrated circuit chip to selectively control thermal coupling between the integrated circuit chip and the thermal spreader.

In a further aspect, a thermal dissipation method is provided for an electronic device having a heat generating component. The method includes: providing a thermal spreader having a surface which is to thermally couple to a surface of the heat generating component, wherein the heat generating component has a non-uniform thermal distribution across its surface between at least one first region of the surface and at least one second region of the surface, and wherein the at least one first region has higher heat flux than the at least one second region; and providing a thermal interface for the surface of the thermal spreader for facilitating heat transfer between the heat generating component and the thermal spreader when the thermal spreader is disposed with the thermal interface in contact with the surface of the heat generating component, wherein the thermal interface covers only a portion of the surface of the thermal spreader to selectively thermally couple the thermal spreader to the surface of the heat generating component.

To restate, provided herein is a thermal spreader and interface assembly useful in cooling a heat generating component such an integrated circuit chip. The thermal interface resides on only a portion of the surface of the thermal spreader designed to couple to a surface of the heat generating component. When in use, heat dissipation is facilitated in those regions where the thermal interface physically connects the surfaces of the thermal spreader and the heat generating component, while an air gap limits direct thermal transfer in the remaining portions of the surfaces of the thermal spreader and heat generating component. By selectively placing the thermal interface, enhanced cooling performance can be obtained by allowing handling of high heat flux zones on a component, such as an integrated circuit chip, while still cooling the entire component to acceptable temperatures thereby establishing a more uniform temperature distribution on the component. This advantageously facilitates integrated circuit design and operation.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, provided herein is a thermal dissipation assembly for facilitating cooling within an electronic device, such as an electronic module. The assembly is configured to thermally couple to a heat generating component, such as an integrated circuit chip, disposed within the electronic device. The assembly includes a thermal spreading plate having a surface which is to thermally couple to an outer surface of the heat generating component, wherein it is assumed that the heat generating component has a non-uniform thermal distribution across its outer surface. The assembly further includes a thermal interface designed to cover only a portion of the surface of the thermal spreading plate to selectively thermally couple the thermal spreader to the surface of the heat generating component in order that both the absolute device temperature and the device temperature differential across the surface of the heat generating component are minimized. This is in part achieved by aligning the thermal interface to known regions of high heat flux on the surface of the heat generating component.

Figure 1:
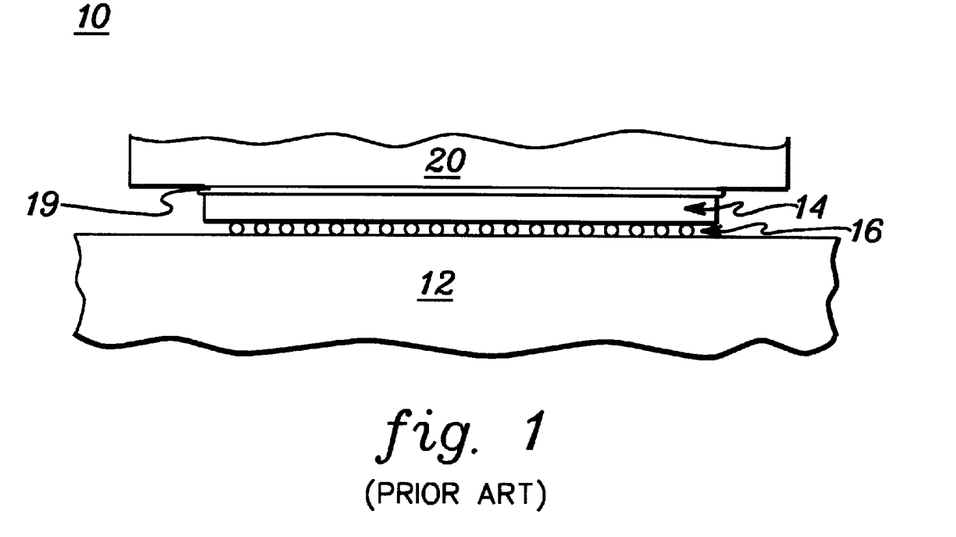
FIG. 1 is a partial elevational view of a prior art embodiment of an electronic module employing a thermal paste between an integrated circuit chip and heat sink.

FIG. 1 depicts a conventional electronic device, generally denoted 10, wherein an integrated circuit chip 14 is mounted to a substrate 12. Chip 14 may be electrically connected 16 to one or more conductive planes (not shown) within substrate 12. A thermally conductive cap 20 is coupled to an exposed surface of integrated circuit chip 14 via a thermal paste 19. As one example, the thermal paste may comprise an Advanced Thermal Compound paste such as described in U.S. Pat. Nos. 5,591,789 and 5,604,978.

As noted above, CMOS semiconductor processing has progressed to the point where multiple processors and their associated control and support (memory) circuits are being placed on a single integrated circuit chip. The result, from a thermal standpoint, is an integrated circuit chip with a highly non-uniform heat flux distribution, i.e., a relatively high heat flux in the processor core region(s), and a low relative heat flux in the control or support regions. The core region heat flux can be as much as fifteen times greater than that of the other regions. A conventional conduction cooling scheme such as depicted in FIG. 1 is not well suited to handle such disparate fluxes on the integrated circuit chip. The cooling approach of FIG. 1 results in an equally disparate circuit temperature distribution, and more significantly, a higher absolute junction temperature within the high heat flux regions.

Figure 2:
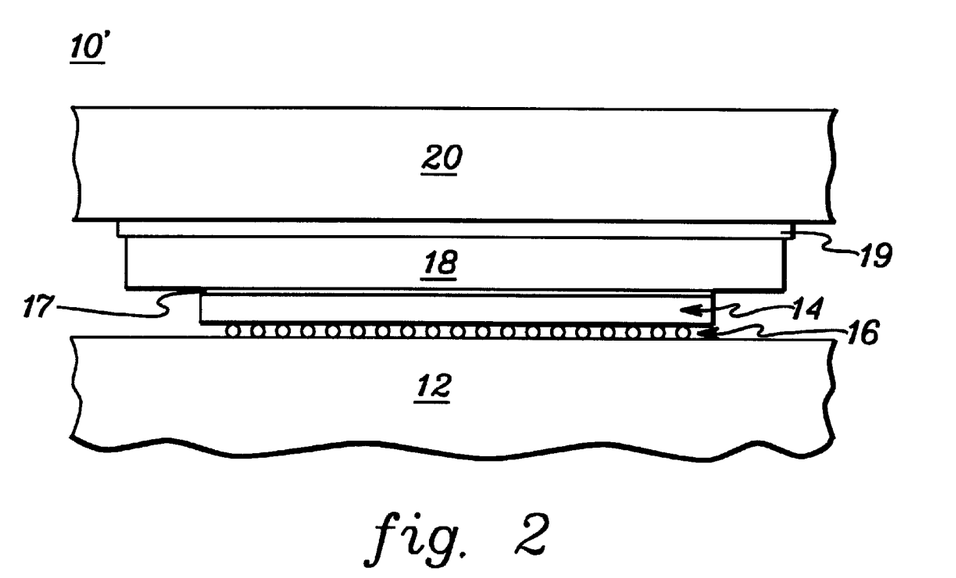
FIG. 2 is a partial elevational view illustrating one embodiment of an electronic module employing a thermal spreading plate.

FIG. 2 depicts one embodiment of an electronic device, denoted 10', having improved thermal performance by introducing a thermal spreader plate 18 between integrated circuit chip 14 and thermally conductive cap 20. Plate 18 is thermally coupled to cap 20 via a thermal paste 19, and a solder or oil interface may exist between plate 18 and chip 14 to enhance thermal conductivity therebetween. Thermal spreader plate 18, which for example may comprise a monolithic piece of high thermal conductivity material, improves the heat removal capability to the system. When used to reduce peak device temperature on a highly non-uniform heat flux chip, the interface resistance between the thermal spreader plate and the chip must be considerably lower than that of a conventional paste gap approach. Table 1 shows that an oil or solder interface can meet this requirement.

TABLE 1

| Interface | Relative Thermal Resistance |
|---|---|
| 7 mils ATC 4.5 Paste (90% Coverage) | 22 |
| 20 mils Eutectic PbSn Solder | 5 |
| 1 um PAO Oil | 2.8 |
| 4 mils Eutectic PbSn Solder | 1 |

The high thermal conductivity of the spreader makes it an effective extended surface for heat transfer thus spreading the heat flow and, concomitantly, lowering temperatures. Unfortunately, an appreciable device temperature difference still exists that tends to complicate circuit design and compound thermal strain of both C4 joints and the chip/spreader interface joint.

Presented herein is a thermal dissipation assembly designed to balance temperature across an integrated circuit chip (i.e., minimize the device temperature difference), while also minimizing the absolute device temperature itself. This is accomplished by selectively defining the location and area of thermal contact of the thermal interface disposed between the integrated circuit chip and the thermal spreader. This concept is illustrated, by way of example only, in the embodiments of FIGS. 4A–6B discussed further below.

Figure 3A:
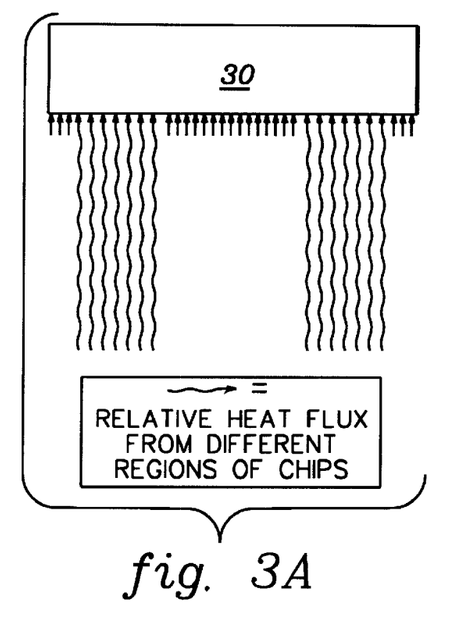
FIG. 3A is a side elevational view of one embodiment of an integrated circuit chip having a non-uniform heat flux across the chip.
Figure 3B:
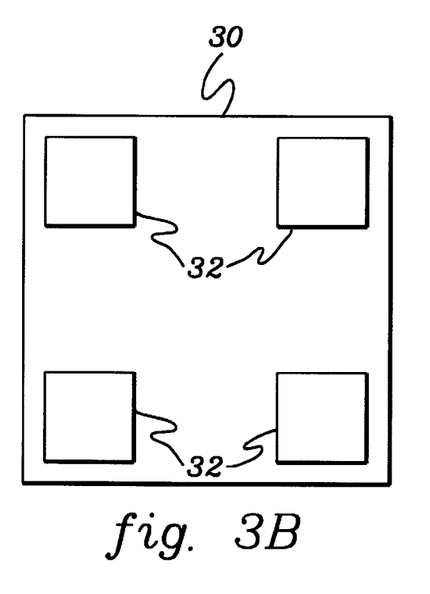
FIG. 3B is a plan view depiction of high heat flux regions and low heat flux regions of the integrated circuit chip of FIG. 3A.
Figure 7:
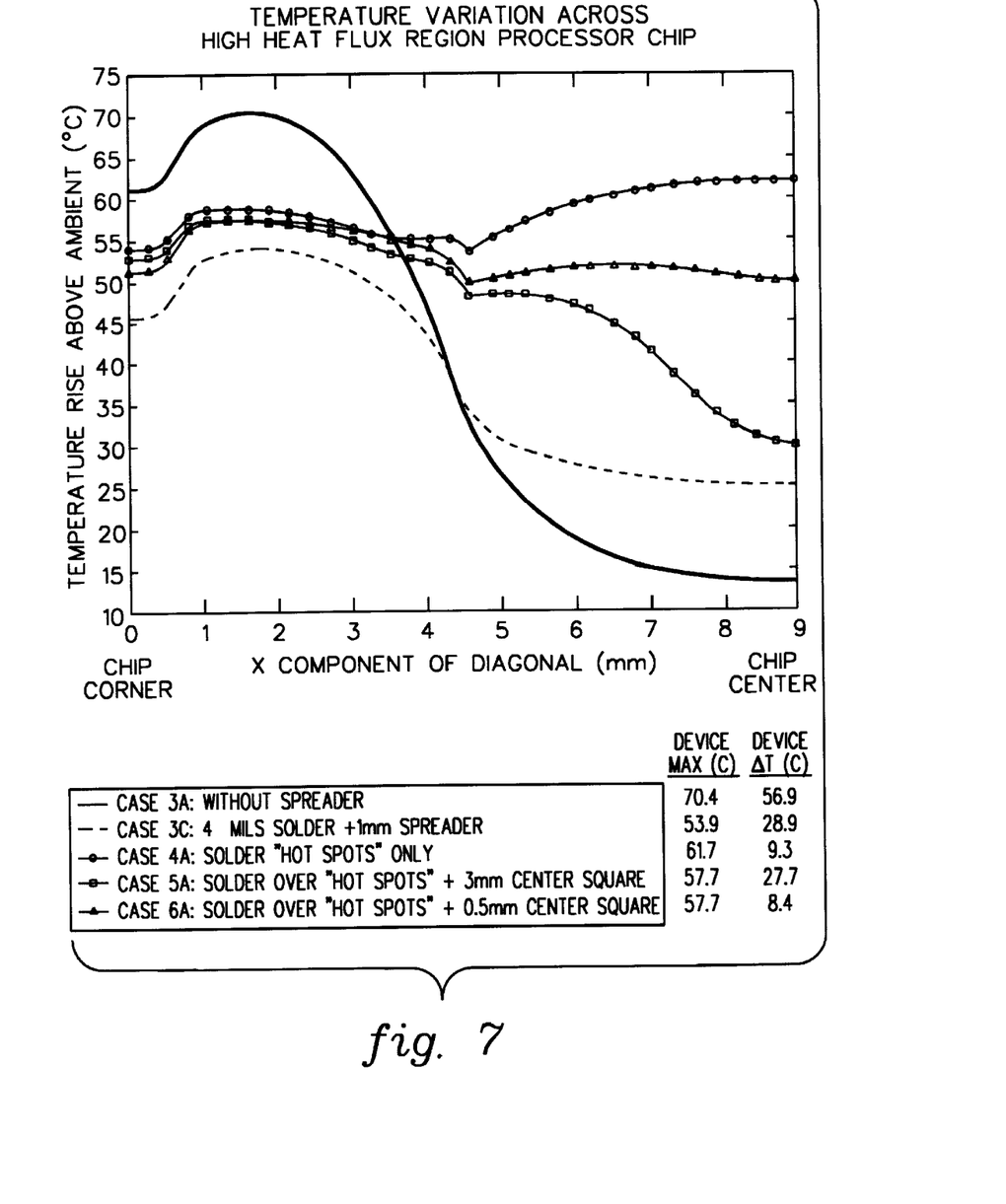
FIG. 7 graphically depicts temperature variation across an integrated circuit chip having non-uniform heat flux for the structures of FIGS. 3A, 3C, 4A, 5A & 6A.

Referring first to FIGS. 3A–3C, an integrated circuit chip 30 having four distinct high heat flux regions 32 is depicted in FIGS. 3A & 3B. As shown in FIG. 3B, the high heat flux regions 32 are located at the corners of the integrated circuit chip. The heat flux in these regions can be up to fifteen times greater than that of the remaining area of the chip as depicted by the arrows in FIG. 3A, which are representative of the relative heat flux in the different regions of the integrated circuit chip. An example temperature profile (case 3A) for this structure is depicted in FIG. 7.

Figure 3C:
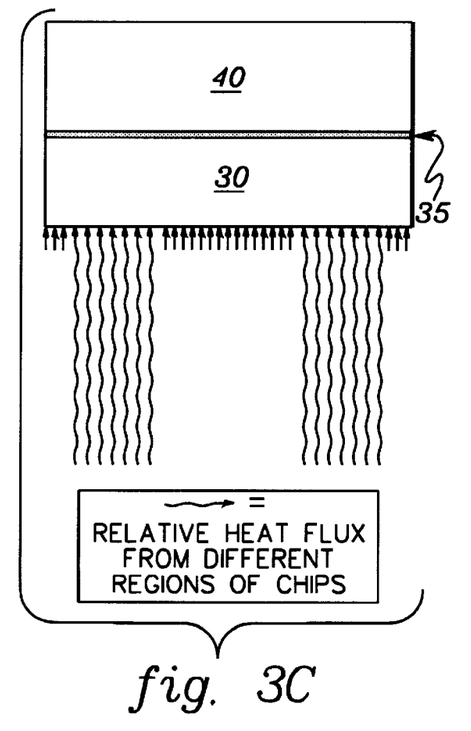
FIG. 3C is an elevational view of the integrated circuit chip of FIG. 3A after a solder interface layer has been employed to affix a thermal spreader to a main surface thereof.

FIG. 3C depicts the integrated circuit chip of FIGS. 3A & 3B with a high thermal conductivity spreader 40 thermally coupled thereto via an interface layer 35. In one embodiment, the spreader may comprise oxygen-free copper (OFCU) which is soldered to the integrated circuit chip with a eutectic lead-tin (PbSn) solder. In this example, the solder interface between the spreader and the integrated circuit chip is uniform over the entire contact area. If representative heat fluxes (180W/cm$^2$ and 11.5W/cm$^2$) are applied to the chip, and a representative convective boundary condition (15,000W/m$^2$K) is applied to the back surface of the chip or the spreader, the resulting device temperature profile from the corner to the center of the chip would be as depicted in FIG. 7 (i.e., case 3C). The maximum device temperature (Tmax) is shown to be brought down from 70.4° C. to 53.9° C. when the spreader is added, but the device temperature delta (ΔT) is still high at almost 29 deg C.

Figure 4A:
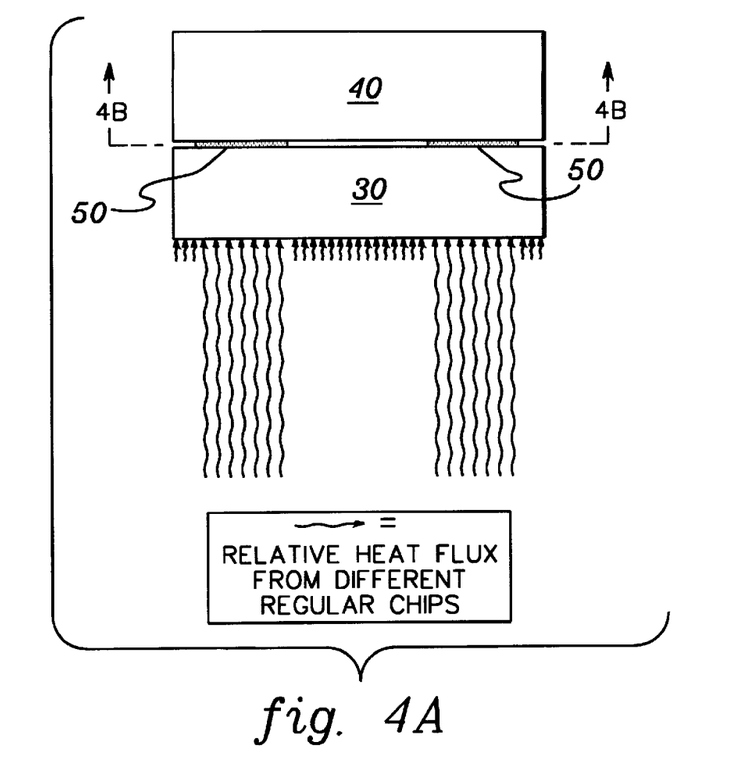
FIG. 4A is an elevational view of one embodiment of an integrated circuit chip and thermal spreader and interface assembly in accordance with the principles of the present invention.
Figure 4B:
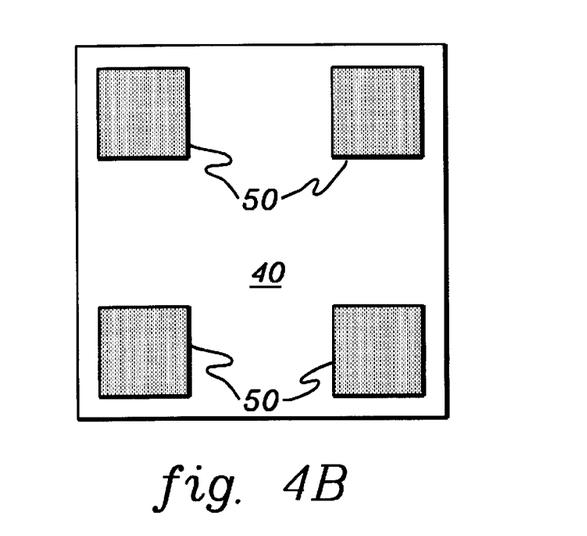
FIG. 4B is a plan view depiction of the coupling surface of the thermal spreader and interface assembly of FIG. 4A viewed along line 4B—4B.

FIGS. 4A–6B depict various embodiments of a thermal dissipation assembly in accordance with the principles of the present invention. In the embodiment of FIGS. 4A & 4B, solder 50 is shown selectively applied as a thermal interface between integrated circuit chip 30 and thermal spreader 40. In this embodiment, the solder 50 is disposed to align to the higher heat flux areas 32 of FIG. 3B. Again, this particular solder interface pattern is shown by way of example only. In one embodiment, the pattern of the solder interface can be chosen to correspond to any configuration of high heat flux regions of the integrated circuit chip. As shown in FIG. 7, Tmax for case 4A is in the center of the integrated circuit chip rising to 61° C.

Figure 5A:
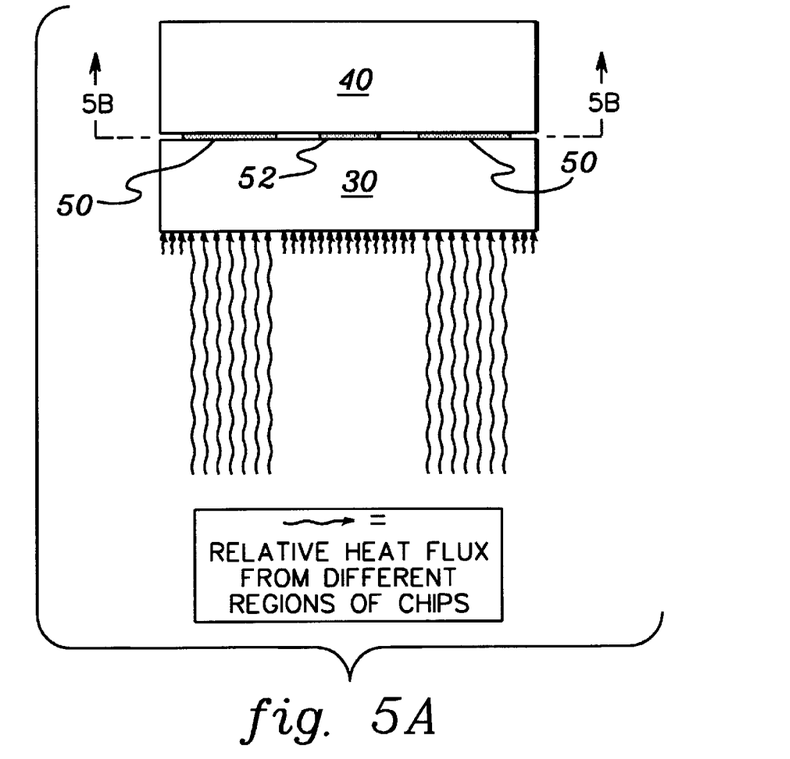
FIG. 5A is an elevational view of an alternate embodiment of a thermal spreader and interface assembly in accordance with the principles of the present invention shown attached to an integrated circuit chip having a non-uniform heat flux.
Figure 5B:
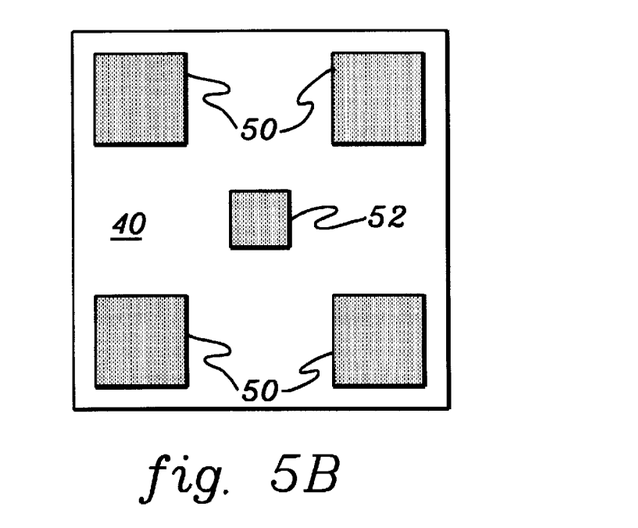
FIG. 5B is a plan view depiction of the surface of the thermal spreader and interface assembly of FIG. 5A viewed along line 5B—5B.
Figure 6A:
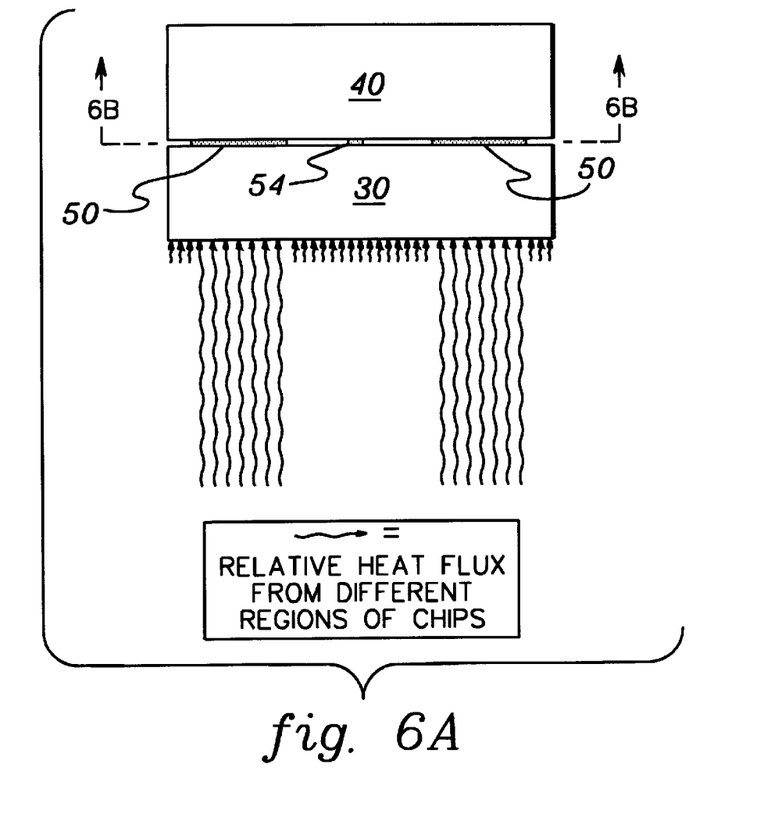
FIG. 6A is an elevational view of a further embodiment of a thermal spreader and interface assembly in accordance with the principles of the present invention shown attached to an integrated circuit chip having a non-uniform heat flux.
Figure 6B:
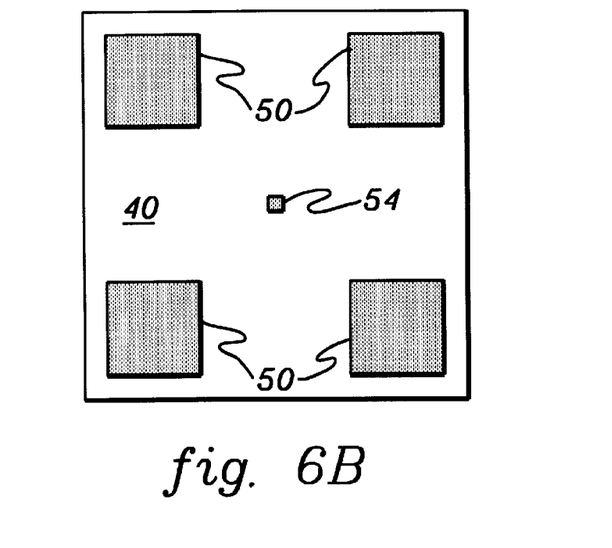
FIG. 6B is a plan view depiction of the surface of the thermal spreader and interface assembly of FIG. 6A viewed along line 6B—6B.

In the example of FIGS. 5A & 5B, a 3 mm square solder contact 52 is placed in the center of the chip in the region of lower heat flux. This is in addition to the solder 50 over the high heat flux regions. With this configuration, Tmax (case 5A in FIG. 7) drops down to just below 58 deg C, but ΔT is still high (i.e., 28 deg C). Reducing the size of the center contact to approximately 0.5 mm square 54 as shown in FIGS. 6A & 6B pulls the center temperature up to a point where ΔT is acceptable. Case 6A of FIG. 7 therefore represents a situation where both Tmax and ΔT have been minimized using a thermal dissipation assembly in accordance with the present invention.

Those skilled in the art will note that integrated circuit chips with differing heat flux magnitudes and distributions will require a different interface contact pattern to minimize Tmax and ΔT. Commonly practiced photolithographic processing can be used to selectively metalize either an exposed surface of an integrated circuit chip, such as a back surface, or a surface of the thermal spreader to be coupled to the integrated circuit chip. Likewise, commonly practiced masking techniques can be used to prevent solder from adhering to unwanted areas, for example on the spreader. Preforms with non-reactive spacers commonly used in module solder seals could be used to control the quantity of solder required and the final thickness of the solder joint.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A thermal dissipation assembly for an electronic device, said thermal dissipation assembly comprising:

a thermal spreader having a surface which is to thermally couple to a surface of a heat generating component of an electronic device, said heat generating component having a non-uniform thermal distribution across said surface thereof between at least one first region of said surface and at least one second region of said surface, wherein said at least one first region has higher heat flux than said at least one second region; and a thermal interface attached to said surface of said thermal spreader for facilitating heat transfer between said heat generating component and said thermal spreader when said thermal spreader is disposed with said thermal interface in contact with said surface of said heat generating component, wherein said thermal interface covers only a portion of said surface of said thermal spreader to selectively thermally couple said thermal spreader to said surface of said heat generating component; and wherein said thermal interface comprises a high unit conductance thermal interface comprising multiple high unit conductance thermal contacts aligned to contact said surface of said heat generating component in said at least one first region of higher heat flux and in only a portion of said at least one second region, said thermal interface having at least one thermal contact of said multiple thermal contacts which contacts only said portion of said at least one second region, wherein said at least one thermal contact is sized and positioned to minimize a temperature difference across said surface of said heat generating component when said thermal dissipation assembly is placed in contact therewith, and wherein said thermal interface establishes a partial air gap between said thermal spreader and said surface of said heat generating component when said thermal dissipation assembly is placed in contact therewith.

2. The thermal dissipation assembly of claim 1, wherein said at least one first region comprises multiple first regions, and wherein said thermal interface is aligned to contact said surface of said heat generating component in each of said multiple first regions of higher heat flux.

3. The thermal dissipation assembly of claim 2, wherein said heat generating component comprises an integrated circuit chip, and wherein at least some of said multiple first regions comprise corners of said integrated circuit chip.

4. The thermal dissipation assembly of claim 1, wherein said thermal interface comprises a patterned layer of thermally conductive material.

5. The thermal dissipation assembly of claim 4, wherein said patterned layer of thermally conductive material comprises a patterned layer of solder.

6. The thermal dissipation assembly of claim 1, wherein said thermal interface contacts said at least one second region near a center thereof when said thermal dissipation assembly is placed in contact with said heat generating component.

7. The thermal dissipation assembly of claim 1, wherein said thermal spreader comprises a thermal spreading plate with said surface thereof having a surface area at least equal to a surface area of said surface of said heat generating component, and wherein said heat generating component comprises an integrated circuit chip.

8. The thermal dissipation assembly of claim 7, wherein said thermal spreading plate comprises one of oxygen-free copper, aluminum nitride, or silicon carbide.

9. An electronic device comprising:
   an integrated circuit chip having a non-uniform thermal distribution across a surface thereof between at least one first region of said surface and at least one second region of said surface, wherein said at least one first region has higher heat flux than said at least one second region; and
   a thermal dissipation assembly thermally coupled to said integrated circuit chip, said thermal dissipation assembly including:
      a thermal spreader having a surface thermally coupled to said surface of said integrated circuit chip;
      a thermal interface thermally connecting said surface of said thermal spreader and said surface of said integrated circuit chip for facilitating heat transfer between said integrated circuit chip and said thermal spreader, wherein said thermal interface covers only a portion of said surface of said integrated circuit chip to thermally couple said thermal spreader to selected areas of said surface of said integrated circuit chip; and
      wherein said thermal interface comprises a high unit conductance thermal interface comprising multiple high unit conductance thermal contacts aligned to contact said surface of said integrated circuit chip in said at least one first region of higher heat flux and in only a portion of said at least one second region, said thermal interface having at least one thermal contact of said multiple thermal contacts which contacts only said portion of said at least one second region, wherein said at least one thermal contact is sized and positioned to minimize a temperature difference across said surface of said integrated circuit chip when said thermal dissipation assembly is placed in contact therewith, and wherein said thermal interface establishes a partial air gap between said thermal spreader and said surface of said integrated circuit chip when said thermal dissipation assembly is placed in contact therewith.

10. The electronic device of claim 9, wherein said at least one first region comprises multiple first regions, and wherein said thermal interface contacts said surface of said integrated chip in each of said multiple first regions of higher heat flux.

11. The electronic device of claim 9, wherein said thermal interface comprises a patterned layer of thermally conductive material.

12. The electronic device of claim 9, wherein said thermal interface contacts said at least one second region near a center thereof.

13. A thermal dissipation method for an electronic device having a heat generating component, said method comprising:
   providing a thermal spreader having a surface which is to thermally couple to a surface of a heat generating component, said heat generating component having a non-uniform thermal distribution across said surface thereof between at least one first region of said surface and at least one second region of said surface, wherein said at least one first region has higher heat flux than said at least one second region;
   providing a thermal interface attached to said surface of said thermal spreader for facilitating heat transfer between said heat generating component and said thermal spreader when said thermal spreader is disposed with said thermal interface in contact with said surface of said heat generating component, wherein said thermal interface covers only a portion of said surface of said thermal spreader to selectively thermally couple said thermal spreader to said surface of said heat generating component; and
   wherein said thermal interface comprises a high unit conductance thermal interface having multiple high unit conductance thermal contacts, and wherein said providing said thermal interface comprises aligning said thermal interface to contact said surface of said heat generating component in said at least one first region of higher heat flux and in only a portion of said at least one second region, said thermal interface having at least one thermal contact of said multiple thermal contacts which contacts only said portion of said at least one second region, wherein said at least one thermal contact is sized and positioned to minimize a temperature difference across said surface of said heat generating component when said thermal dissipation assembly is placed in contact therewith, and wherein said thermal interface establishes a partial air gap between said thermal spreader and said surface of said heat generating component when said thermal dissipation assembly is placed in contact therewith.

14. The method of claim 13, wherein said providing said thermal interface comprises forming a patterned layer of thermally conductive material on at least one of said surface of said thermal spreader or said surface of said heat generating component.

15. The method of claim 14, wherein said heat generating component comprises an integrated circuit chip having multiple first regions of higher heat flux, and wherein said providing said thermal interface comprises forming said patterned layer of thermally conductive material to contact each of said multiple first regions of higher heat flux.

16. The method of claim 15, wherein said providing said thermal interface comprises forming said patterned layer of thermally conductive material such that said thermally conductive material contacts said at least one second region near a center thereof.

* * * * *